United States Patent [19]

Ichikawa

[11] Patent Number: 4,903,328

[45] Date of Patent: Feb. 20, 1990

[54] AUTOMATIC FREQUENCY SWEEPING METHOD FOR CONTROLLING A FREQUENCY SYNTHESIZING TYPE AUTOTUNER

[75] Inventor: Masaomi Ichikawa, Tokyo, Japan

[73] Assignee: NEC Corporation, Tokyo, Japan

[21] Appl. No.: 215,476

[22] Filed: Jul. 5, 1988

[30] Foreign Application Priority Data

Jul. 3, 1987 [JP] Japan .................................. 62-167254

[51] Int. Cl.$^4$ .............................................. H04B 1/16
[52] U.S. Cl. .................................... 455/165; 455/164; 455/183; 455/260
[58] Field of Search ............... 455/165, 255, 256, 257, 455/258, 260, 182, 183, 164, 166

[56] References Cited

U.S. PATENT DOCUMENTS

| | | | |
|---|---|---|---|
| 4,207,522 | 6/1980 | Thornton et al. | 455/165 |
| 4,476,580 | 10/1984 | Tanaka et al. | 455/165 |
| 4,709,406 | 11/1987 | Omoto | 455/183 |

FOREIGN PATENT DOCUMENTS

| | | | |
|---|---|---|---|
| 0045814 | 11/1977 | Japan | 455/165 |
| 0205323 | 11/1983 | Japan | 455/165 |

Primary Examiner—Robert L. Griffin
Assistant Examiner—Ralph Smith
Attorney, Agent, or Firm—Foley & Lardner, Schwartz, Jeffery, Schwaab, Mack, Blumenthal & Evans

[57] ABSTRACT

An automatic frequency sweeping method for controlling frequency synthesizing type autotuners for broadcasting receivers comprises a first intermediate frequency counting method in which the intermediate frequency is counted for a relatively short first time and the presence or absence of the received signal is judged in a first range having a relatively wide intermediate frequency width and a second intermediate frequency counting method in which the intermediate frequency is counted for a second time longer than the first time and the presence or absence of the received signal is judged in a second range having a intermediate frequency width narrower than that of the first range. Thus, a high speed frequency sweeping is ordinarily executed by using the first intermediate frequency counting method, and when the presence of the received signal is judged in the first intermediate frequency counting method, a more precise judgement is made in accordance with the second intermediate frequency counting method.

20 Claims, 3 Drawing Sheets

AUTOMATIC FREQUENCY SWEEPING METHOD FOR CONTROLLING A FREQUENCY SYNTHESIZING TYPE AUTOTUNER

BACKGROUND OF THE INVENTION

1. Field of the Invention

The present invention relates to an automatic frequency sweeping method for controlling a frequency synthesizing type autotuners for broadcasting receivers, and more specifically to an intermediate frequency counting method for stopping the automatic frequency sweeping in the above mentioned method.

2. Description of Related Art

In general, broadcasting receivers incorporating therein frequency synthesizing type autotuners are so adapted to able to detect whether or not a broadcasting signal exists by counting an intermediate frequency. For example, in so-called FM band, assuming that a local oscillator is a lower side oscillator of the phase locked loop (PLL) type and a broadcasting signal exists at a frequency of 80MHz, if the lower side local oscillator generates an signal of 69.3 MHz, an intermediate frequency of 10.7MHz is obtained as a well known manner, and a result, it is possible to receive the broadcasting frequency signal of 80 MHz. At this time, if the oscillation frequency is deviated with 100 KHz, the intermediate frequency is also deviated with 100 KHz from 10.7 MHz. Therefore, taking into consideration the degree of modulation and noises of the broadcasting frequency, it is allowed to judge that a broadcasting frequency signal exists if the intermediate frequency is in the range of 10.7 MHz±25 KHz.

Thus, in broadcasting receivers adapted to execute the automatic frequency sweeping in response to a key input, the automatic frequency sweeping operation is performed as follows: When the key input is given, the oscillation frequency is shifted by a frequency corresponding to one channel space by action of the PLL and associated controller. Then, after the PLL is locked, presence of the intermediate frequency is discriminated. If no broadcasting signal is detected, the oscillation frequency is shifted by the channel space again and presence of the intermediate frequency is discriminated. This operation is repeated, and when the broadcasting signal is judged to exist, the automatic frequency sweeping is stopped.

For example, in the FM band of Japan, frequencies are allocated to FM broadcasting stations with frequency intervals of 100 KHz, and in the FM band of U.S.A., frequencies are allocated to FM broadcasting stations with frequency intervals of 200 KHz. Further, in Europe, frequencies are, as a general rule, allocated to FM broadcasting stations with frequency intervals of 100 KHz. Therefore, if a receiving frequency is changed (incremented or decremented) in accordance with the automatic frequency sweeping, the frequency of the local oscillator has to be changed with only an inter-station frequency (one channel space), and then, after the PLL is locked, a gate is opened for only 4 milliseconds so that the intermediate frequency signal is supplied to a so-called intermediate frequency counter. Thus, the intermediate frequency counter counts the intermediate frequency signal for a period of 4 milliseconds. Here, assuming that when the intermediate frequency is in the range of 10.7 MHz±25 KHz as mentioned above, it is judged that the broadcasting signal is present, when the value of intermediate frequency counter is in the range of 42,800±100, the automatic frequency sweeping is stopped. If the value of the intermediate frequency counter is not in the above mentioned range, the frequency of the local oscillator is changed with 100 KHz again, and the same operation is repeated.

If the range for judging the presence of the broadcasting frequency is changed, it is possible to perform the automatic frequency sweeping in the AM band in the same manner.

However, in fact, if the presence of the broadcasting signal is judged on the basis of only one counting of the intermediate frequency for 4 milliseconds, possibility of mis-judgment cannot be denied. Therefore, the counting operation of 4 milliseconds is repeated three times and if at least two of three counting operations are in the range mentioned above, it is then judged that the broadcasting signal is present.

As seen from the above, the conventional automatic frequency sweeping has required at least 12 milliseconds for counting the intermediate frequency. Therefore, the sweeping from a minimum frequency channel to a maximum frequency channel will take a very long time, particularly in a band such as FM band including a number of channels.

SUMMARY OF THE INVENTION

Accordingly, it is an object of the present invention to provide an automatic frequency sweeping method which has overcome the above mentioned defect of the conventional one.

Another object of the present invention is to provide an automatic frequency sweeping method for controlling frequency synthesizing type autotuners for broadcasting receivers, which is capable of certainly detecting a broadcasting frequency with a very short time and stopping the automatic frequency sweeping.

The above and other objects of the present invention are achieved in accordance with the present invention by an automatic frequency sweeping method for controlling a frequency synthesizing type autotuners for broadcasting receivers, which tuner includes a phase locked loop for controllably generating a local oscillation signal, a mixer receiving a RF received signal and the local oscillation signal for generating an intermediate frequency signal, an intermediate frequency counter receiving the intermediate frequency signal through a gate, and a controller coupled to the phase locked loop, the intermediate frequency counter and the gate and also associated with a key input for instructing the automatic frequency sweeping, the controller operating to open the gate so as to allow the intermediate frequency counter to count the intermediate frequency and to stop the automatic frequency sweeping on the basis of presence or absence of the received signal judged with reference to the count value of the intermediate frequency counter, the method comprising a first intermediate frequency counting method in which the intermediate frequency is counted by opening the gate for a relatively short first time and the presence or absence of the received signal is judged in a first range having a relatively wide intermediate frequency width and a second intermediate frequency counting method in which the intermediate frequency is counted by opening the gate for a second time longer than the first time and the presence or absence of the received signal is judged in a second range having a intermediate frequency width narrower than that of the first range, wherein a high speed frequency sweeping is ordinarily executed by using the first intermediate frequency counting method, and when the presence of the received signal is judged in the first intermediate frequency counting method, a more precise judgment is made in accordance with the second intermediate frequency counting method.

In accordance with another aspect of the present invention, there is provided an automatic frequency sweeping frequency synthesizing type autotuners for broadcasting receivers, which tuner includes a high frequency stage receiving a high frequency signal from an antenna, a phase locked loop for controllably generating a local oscillation signal, a mixer receiving an high frequency signal from the high frequency stage and the local oscillation signal for generating an intermediate frequency signal, an intermediate frequency counter receiving the intermediate frequency signal through a gate, and a controller coupled to the phase locked loop, the intermediate frequency counter and the gate and also associated with a key input for instructing the automatic frequency sweeping, the controller operating to open the gate so as to allow the intermediate frequency counter to count the intermediate frequency and to stop the automatic frequency sweeping on the basis of presence or absence of the received signal judged with reference to the count value of the intermediate frequency counter, wherein the improvement in that the controller selectively executes a first intermediate frequency counting method in which the intermediate frequency is counted by opening the gate for a relatively short first time and the presence or absence of the received signal is judged in a first range having a relatively wide intermediate frequency width and a second intermediate frequency counting method in which the intermediate frequency is counted by opening the gate for a second time longer than the first time and the presence or absence of the received signal is judged in a second range having a intermediate frequency width narrower than that of the first range, so that a high speed frequency sweeping is ordinarily executed by using the first intermediate frequency counting method, and when the presence of the received signal is judged in the first intermediate frequency counting method, a more precise judgment is made in accordance with the second intermediate frequency counting method.

The above and other objects, features and advantages of the present invention will be apparent from the following description of preferred embodiments of the invention with reference to the accompanying drawings.

DESCRIPTION OF THE PREFERRED EMBODIMENTS

Figure 1:
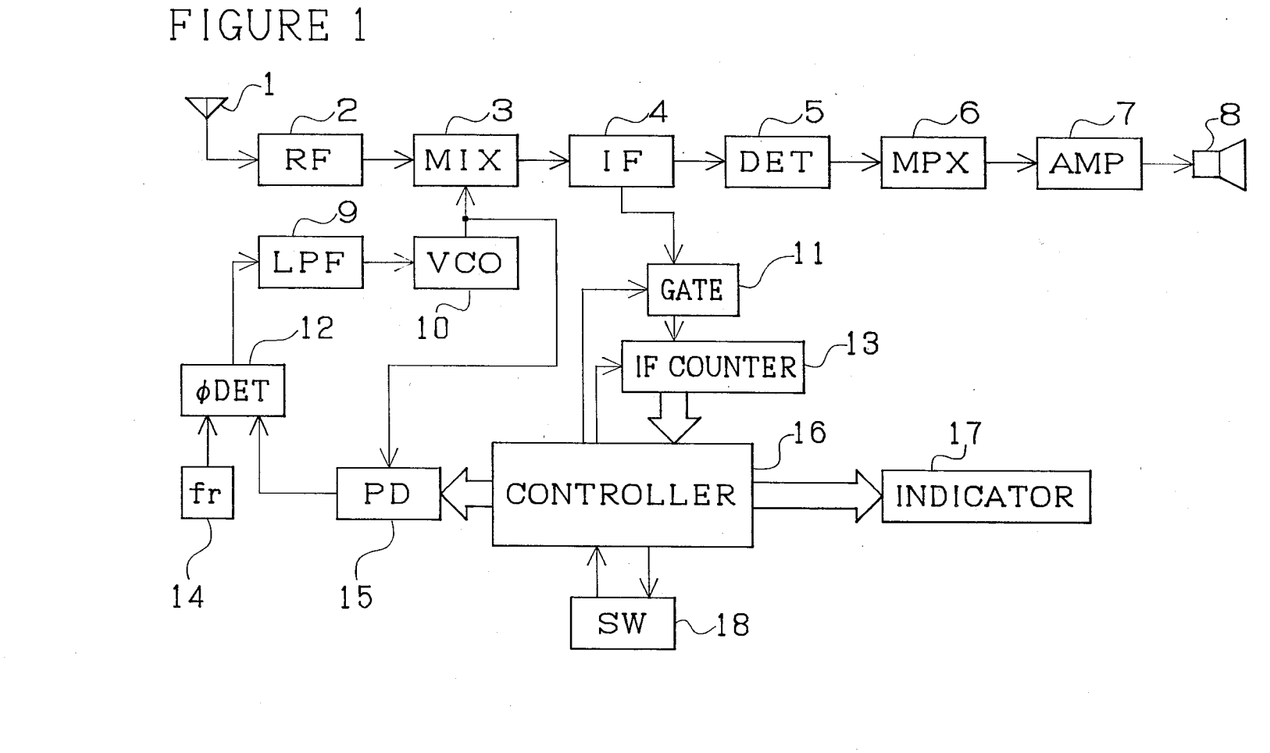
FIG. 1 a block diagram of a broadcasting receiver including a frequency synthesizing type autotuners for broadcasting receivers, capable of embodying an automatic frequency sweeping method in accordance with the present invention.

Referring to FIG. 1, there is shown a block diagram of a broadcasting receiver including a frequency synthesizing type autotuners for broadcasting receivers, capable of embodying an automatic frequency sweeping method in accordance with the present invention. The shown receiver an antenna 1 and a high frequency stage 2 having an input connected to the antenna 1 and adapted to execute a tuning and high frequency amplification. An output of the high frequency stage 2 is connected to a mixer 3, which is also connected to receive an output of a local oscillator 10, so that the mixer 3 generates an intermediate frequency signal representative of a difference between the frequency of the received signal from the high frequency stage 2 and the frequency of the oscillation signal of the local oscillator 10. The intermediate frequency signal is applied to an intermediate frequency amplifier 4 so that it is amplified by the intermediate frequency amplifier 4 whose output is connected to a detector 5. An output of the detector 5 is connected to a stereo demodulator 6 where an audio signal is reproduced. The audio signal is amplified by an low frequency amplifier 7 and then inputted to a loudspeaker 8.

Further, the intermediate frequency signal is supplied through a gate 11 to an intermediate frequency counter 13 which can be formed of for example a shift register. A count output of the intermediate frequency counter 13 is coupled to a controller 17. On the other hand, the above mentioned local oscillator 10 is composed of for example a voltage controlled oscillator (VCO) and an output of the VCO 10 is connected not only to the mixer 3 but also to a programmable frequency divider 15. This frequency divider 15 has a frequency division ratio which is programmed or set by the controller 16. An output of the frequency divider 15 is one input of a phase comparator 12 whose other input is connected to receive an output of a reference frequency generator 14. In addition, an output of the phase comparator 12 is supplied through a low pass filter 9 to VCO which constitutes the local oscillator 10. Thus, a phase locked loop is formed by the programmable frequency divider 15, the phase comparator 12, low pass filter 9 and the VCO 10.

The controller 16 is also coupled to an indicator 17 and key input 18. In addition, if the controller 16 is composed of a single chip microcomputer, it can be understood to persons skilled in the art that the controller can control the associated elements, such as key input 18, programmable frequency divider 15, the gate 11, the intermediate frequency counter 13 and the indicator 17.

Figure 2:
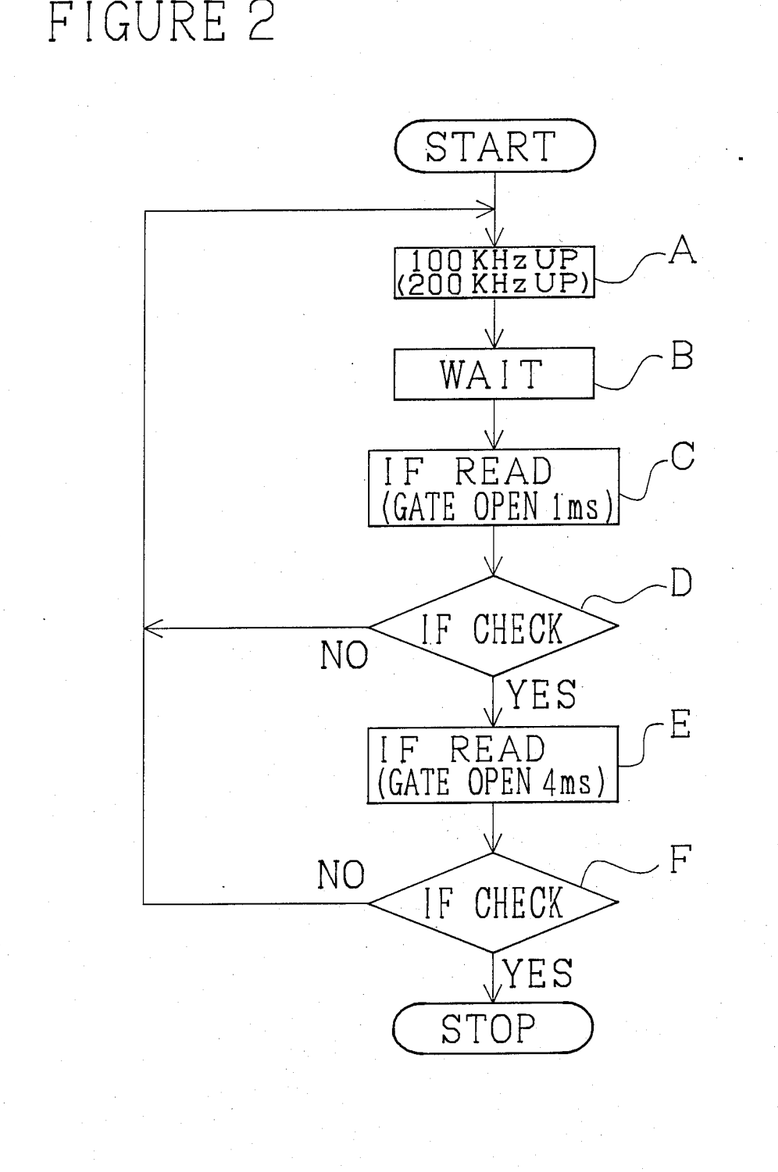
FIG. 2 a flow chart of illustrating one embodiment of the automatic frequency sweeping method in accordance with the present invention, which can be realized by the controller shown in the frequency synthesizing type autotuners shown in FIG. 1.

Referring to FIG. 2, there is shown a flow chart of illustrating the automatic frequency sweeping operation in accordance with the present invention, which can be realized by the controller 16 in response to a depression of a button in the key input 18 for an automatic frequency sweeping operation in an up direction. This embodiment is made to comply with the FM band of Japan and U.S.A. However, the FM band of Japan is different from FM band of U.S.A. in the channel spacing, as mentioned above. Therefore, operation will be first described on the receiving of the FM band of Japan.

In Japan, the local oscillator 10 is of a lower oscillation for superheterodyne detection, and the intermediate frequency is 10.7 MHz. In addition, the reference frequency generator 14 is set to generate a reference signal of 100 KHz. Under these condition, if one wishes to receive a FM broadcasting of 80 MHz, the controller 16 operates to set the frequency division ratio of 693 to the programmable frequency divider 15, so that phase locked loop (PLL) composed of the programmable frequency divider 15, the phase comparator 12, the low pass filter 9 and the local oscillator 10 will generates the local oscillation signal of 69.3 MHz. Thus, the broadcasting signal of 80 MHz received by the antenna 1 and outputted from the high frequency stage 2 is converted by the mixer 3 to the intermediate frequency of 10.7 MHz. As a result, the broadcasting signal of 80 MHz can be listened.

In this condition, if the button in the key input 18 for an automatic frequency sweeping operation in an up direction is depressed, the controller 16 operates as illustrated in the flow chart of FIG. 2.

In Step A, the programmable divider 15 is set to the frequency division ratio "694" since the channel space is 100 KHz in Japan. As a result, the oscillation frequency of the local oscillator 10 is incremented to 69.4 MHz. The setting of the frequency division ratio needs about 10 milliseconds.

In Step B, the receiver is put in a wait condition until the PLL is brought into a stabilized condition and therefore the stabilized intermediate frequency is outputted from the intermediate frequency amplifier 4. This wait time is about 10 milliseconds.

In Step C, the gate 11 is opened for only 1 millisecond, so that the intermediate frequency of the intermediate frequency amplifier 4 is counted by the intermediate frequency counter 13 for only 1 millisecond, and the count value of the counter is read out and written into the controller 16. This operation is repeated three times.

In Step D, the controller 16 decides whether or not at least two of the three intermediate frequency count values written into the controller 16 in the process of Step C are in the range of 10,700±45. If two of the three are in this range, it goes to Step E. If not so, Steps A, B, C and D are repeated again.

The operation of the above mentioned Steps B and C is called a "first intermediate frequency counting method". The intermediate frequency count value of 10,700±45 means that the intermediate frequency is in the range of 10.7 MHz±45 KHz. Since the gate 11 is opened for only a very short time such as 1 milliseconds, a detection is made in a wide range such as 10.7 MHz±45 KHz in order to prevent a misjudgment.

Here, assuming that a broadcasting frequency upwardly adjacent to the broadcasting frequency of 80 MHz is 82.5 MHz, the controller 16 repeats the operation of the Steps A, B, C and D 25 times. In the 25th operation, the local oscillator 10 generates the oscillation signal of 71.8 MHz and therefore the broadcasting signal of 82.5 MHz is converted in the intermediate frequency signal of 10.7 MHz. As a result, the controller 16 will decide in the Step D that at least two of the three intermediate frequency count values are in the range of 10,700±45, and therefore, it goes to Step E.

In the Step E, similarly to the Step C, the gate 11 is opened and the intermediate frequency signal is counted by the intermediate frequency counter 13 and then result of the counting is read out and written into the controller 16. This operation is repeated three times.

But, the the open time of the gate 11 in the step E is 4 milliseconds.

In the next Step F, the controller 16 decides whether or not at least two of the three intermediate frequency count values written in the process of Step C are in the range of 42,800±100. If two of the three are in this range, it is judged that the broadcasting frequency is present and therefore the automatic frequency sweeping operation is stopped. If not so, the detection of the broadcasting signal in accordance with the first intermediate frequency counting method composed of the steps C and D has been in error and the operation is returned to the Step A, again.

The intermediate frequency count value of 42,800±100 means that the intermediate frequency is in the range of 10.7 MHz±25 KHz. The above steps has an open time (4 milliseconds) of the gate 11 than the first intermediate frequency counting method and detected the presence and absence of the broadcasting in a range narrower than that of the first intermediate frequency counting method. Namely, a more precise intermediate frequency counting is executed. The operation of the above mentioned Steps E and F is called a "second intermediate frequency counting method".

As mentioned above, the first and second intermediate frequency counting methods will permit that in the case of absence of a broadcasting signal, the time required for incrementing or decrementing the frequency of a received signal by one channel space is shortened by about 10 milliseconds as compared with the conventional method. In the above mentioned example, about 250 milliseconds are reduced in total.

Next, the operation for receiving the FM band of U.S.A. will be described. As mentioned above, the channel space of U.S.A. practice, the channel space is 200 KHz, and the local oscillator 10 is of an upper oscillation. Further, the intermediate frequency is 10.7 MHz. In addition, the reference frequency generator 14 is set to generate a reference signal of 100 KHz. Under these condition, now assume that a FM broadcasting of 88.9 MHz is received and therefore the frequency division ratio of 693 is set to the programmable frequency divider 15, so that the local oscillator 10 will generates the local oscillation signal of 99.6 MHz.

In this condition, if the button in the key input 18 for an automatic frequency sweeping operation in an up direction is depressed, the controller 16 operates in the Step A to increment the frequency division ratio "694" set in the programmable divider 15 by 2, namely to "998". As a result, the oscillation frequency of the local oscillator 10 is incremented by 200 KHz. Thereafter, the first intermediate frequency counting method composed of the Steps B, C and D is executed for detection of the broadcasting signal.

Thus, the operation of the Steps A, B, C and D is repeated 12 times while incrementing the local oscillation frequency by 200 KHz. In the twelfth operation, if it is judged that at least two of the three intermediate frequency count values are in the range of 10,700±45, it goes to Step E. At this time, the programmable frequency divider 15 is set to "1020" (namely, the oscillation frequency of the local oscillator 10 has adjusted to 102.0 MHz). Therefore, it is judged that a broadcasting signal is present in the channel of 91.3 MHz, and accordingly the automatic frequency sweeping operation is stopped. But, if at least two of the three intermediate frequency count values are out of the range of 10,700±45, the operation is returned to the Step A. The operation the Steps E and F is the same as that mentioned above in connection with the Japanese FM band receiving operation.

Figure 3:
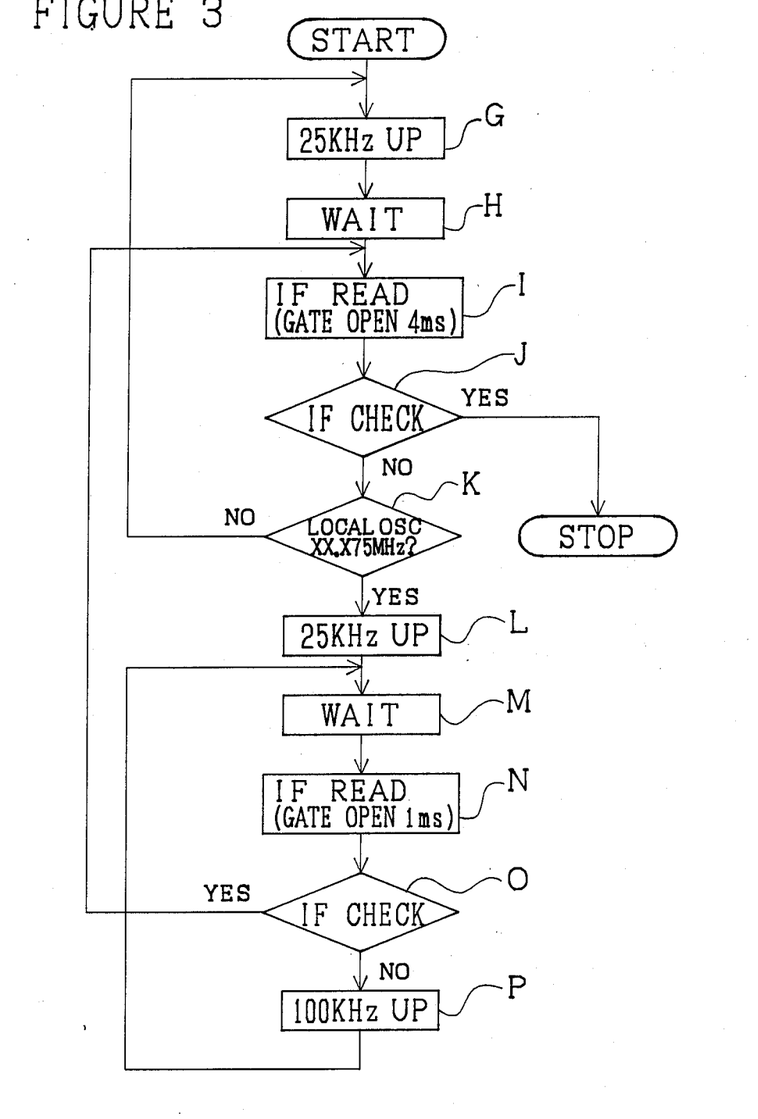
FIG. 3 a flow chart of illustrating another embodiment of the automatic frequency sweeping method in accordance with the present invention, which can be realized by the controller shown in the frequency synthesizing type autotuners shown in FIG. 1.

Turning to FIG. 3, there is shown a flow chart of illustrating the automatic frequency sweeping operation in accordance with the present invention, which can be realized by the controller 16 in response to a depression of a button in the key input 18 for an automatic frequency sweeping operation in an up direction, but which is made to comply with the FM band of Europe.

As mentioned above, a high speed and precise automatic frequency sweeping can be executed by using the first and second intermediate frequency counting methods. As a general rule, the channel space of the European FM band is 100 KHz, but locally 25 KHz or 50 KHz. Therefore, it is desirable to able to receive a broadcasting signal shifted by only 25 KHz or 50 KHz. Accordingly, if the frequency changing (incrementing-/decrementing) step width of the local oscillator 10 is set to 25 KHz, the automatic frequency sweeping can be executed in the flow chart shown in FIG. 2 (where the frequency changing amount is changed from 100 KHz or 200 KHz to 25 KHz). However, the automatic frequency sweeping of this method will require a period of time four times in the area where the channel space is 100 KHz. On the contrary, for example, if the frequency changing step width of the local oscillator 10 is set to 100 KHz, when the automatic frequency sweeping is started from 90.125 MHz, the received frequency is changed in the order of 90.225 MHz, 90.325 MHz, . . . . As a result, it is not possible to receive or precisely tune a broadcasting signal in an area in which the channel space is 100 KHz. Incidentally, in the European FM band, the local oscillator is of the upper oscillation and the intermediate frequency is 10.7 MHz. In addition, the reference frequency generator 14 is set to generate the reference frequency of 25 KHz in the following embodiment.

Now, assume that the broadcasting signal of 99.0 MHz is received, the programmable frequency divider 15 is set to the frequency division ratio of "4388". In this condition, if a button in the key input 18 for an automatic frequency sweeping operation in an up direction is depressed, the controller 11 operates as follows in accordance with the flow chart of FIG. 3.

In Step G, the programmable divider 15 is incremented by "1" and therefore set to the frequency division ratio "4389". As a result, the oscillation frequency of the local oscillator 10 is incremented by 25 KHz.

In Step H, the receiver is put in a wait condition until the PLL is brought into a stabilized condition and therefore the stabilized intermediate frequency is outputted from the intermediate frequency amplifier 4.

In the succeeding Step I, the gate 11 is opened for 4 milliseconds, so that the intermediate frequency of the intermediate frequency amplifier 4 is counted by the intermediate frequency counter 13, and the count value of the counter is read out and written into the controller 16. This operation is repeated three times.

In Step J, if at least two of the three intermediate frequency count values written into the controller 16 in the process of Step J are in the range of 42,800±50, it is judged that the broadcasting signal is present and therefore the automatic frequency sweeping is stopped. If not so, it goes to Step K.

In Step K, there is judged whether or not the oscillation frequency of the local oscillator 10 is "XX.X75 MHz, wherein XX.X is any number". If so, it goes to the step L. But, if not so, it returns to the Step G again. This detection of "XX.X75 MHz" can be easily executed by checking the frequency division ratio in the programmable frequency divider 15.

Now, assuming that the frequency of a broadcasting signal upwardly adjacent to the broadcasting signal of 99.000 MHz is 101.125 MHz, the controller 16 repeats the operation of the Steps G, H, I, J and K three times and goes to Step L. In the course of the three operations of the Steps G, H, I, J and K, the oscillation frequency of the local LSC 10 is sequentially incremented from 109.700 MHz in the order of 109.725 MHz, 109.750 MHz and 109.775 MHz. In addition, whether or not the intermediate frequency is in the range of 10.7 MHz±12.5 KHz is determined. Furthermore, the open time of the gate 11 is set to a relatively long time such as 4 milliseconds and the presence of the intermediate frequency is judged in a narrower range. Accordingly, this intermediate frequency counting method can be called the "second intermediate frequency counting method".

In Step L, the programmable divider 15 is further incremented by "1" and therefore the oscillation frequency of the local oscillator 10 is incremented from 109.775 MHz to 109.800 MHz. In the next Step M, the operation is waited, similarly to the Step H. In Step N, the gate 11 is opened for 1 millisecond, so that the intermediate frequency of the intermediate frequency amplifier 4 is counted by the intermediate frequency counter 13, and the count value of the counter is read out and written into the controller 16. This operation is repeated three times. In Step O, there is judged whether or not at least two of the three intermediate frequency count values written into the controller 16 in the process of Step O are in a predetermined range. In this embodiment, the range in which the presence or absence of the intermediate frequency is detected is from 10,687 to 10,788, namely 10,700±13/88. The intermediate frequency count value in the range of 10,700±13/88 means that the intermediate frequency is in the range of 10.612 MHz to 10.713 MHz. With this feature, if the oscillation frequency of the local oscillator 10 is at 109.800 MHz and if a broadcasting signal exists at the frequency of 99.175 MHz, the intermediate frequency becomes 10.625 KHz which can be detected in the above mentioned range. Namely, the intermediate frequency detection can be executed until a frequency higher than the center frequency of the intermediate frequency by 75 KHz or 3 channel spaces.

In the Step O, if no broadcasting signal is detected, it goes to Step P where the frequency division ratio set in the programmable frequency divider 15 is incremented by only "4" so that the oscillation frequency of the local oscillator 10 is incremented by 100 KHz. Thus, the automatic frequency sweeping composed of the steps P, M, N and O is repeatedly executed. But, the range for judging the presence or absence of the broadcasting signal is set as mentioned above, a broadcasting signal which is allocated with the frequency space of 25 KHz or 50 KHz can be detected. As mentioned hereinbefore, if the next broadcasting signal is of 101.125 MHz, the automatic frequency sweeping operation composed of the steps P, M, N and O is repeated 21 times and as a result, the oscillation frequency of the local oscillator 10 is brought into 111.8 MHz and the intermediate frequency is put to 10.675 MHz. Accordingly, the presence of the broadcasting signal is detected in the step O.

The above mentioned intermediate frequency counting method in the step O is such that the open time of the gate is relatively very short (1 millisecond) and the range for judging the presence or absence of the broadcasting signal is relatively wide. Therefore, this method is called the "first intermediate frequency counting method".

Even if the presence of the broadcasting signal is detected in the step O, it is not actually sure where the broadcasting signal is in the range of 101.100 MHz to 101.715 MHz. Therefore, the operation is returned to the steps I, J, K, G and H so that the presence or absence of the broadcasting signal is executed for every 25 KHz. Thus, the broadcasting signal of 111.125 MHz can be received.

As mentioned above, when no broadcasting signal is present, the detection for a broadcasting signal is executed in accordance with the first intermediate frequency counting method composed of the steps M, N, O and P, while changing (incrementing or decrementing) 100 KHz which corresponds to four channel spaces in an area having the channel space of 25 KHz. Therefore, the automatic frequency sweeping can be carried out at a speed of four times. As a result, when it is judged in the first intermediate frequency counting method that the broadcasting signal is present, the second intermediate frequency counting method composed of the steps I, J, K, G and H is executed so that a more precise tuning can be achieved and also it is possible to receive a broadcasting signal shifted by 25 KHz unit or 50 KHz unit. In addition, even if the received frequency has been for example 90.125 MHz when the automatic frequency sweeping starts, the received frequency is shifted to 90.200 MHz by advancing to the step L, and thereafter, the automatic frequency sweeping can be executed by a 100 KHz step. Therefore, a broadcasting signal can be received in an area having the channel space of 100 KHz.

As mentioned above, in a frequency area in which when no broadcasting signal is present, a high speed frequency sweeping is executed in accordance with the first intermediate frequency counting method having a short frequency counting time and a wide intermediate frequency count range for detecting the presence of the broadcasting signal, and thereafter, when it is judged in the first intermediate frequency counting method that the broadcasting signal is present, a more precise sweeping is executed in accordance with the second intermediate frequency counting method having a long frequency counting time and a narrow intermediate frequency count range for detecting the presence of the broadcasting signal.

In addition, the frequency counting time and the intermediate frequency count range can be controlled by the controller and therefore, it is easy to execute the auto frequency sweeping with a frequency counting time and an intermediate frequency count range which are different from those mentioned above, respectively. Therefore, it is possible to perform the automatic frequency sweeping not only in the FM band but also in the AM band.

Furthermore, when the automatic frequency sweeping is made in a frequency down direction, it is possible to execute the sweeping by decrementing 100 KHz (or 200 KHz), 25 KHz and 100 KHz in the steps A of FIG. 2 and in the steps G and P of FIG. 3, respectively.

Thus, the broadcasting signal selection operation can be hastened, and therefore, a desired broadcasting station can be searched for a short time. Particularly, when an automobile is on the run, receivable broadcasting signals are often replaced. In such case, the high speed frequency sweeping is very convenient not only since it is possible to quickly find out a desired broadcasting signal, but also it is possible to reduce a driver's load in the case that the selection operation is repeated many times.

The invention has thus been shown and described with reference to the specific embodiments. However, it should be noted that the present invention is in no way limited to the details of the illustrated structures but changes and modifications may be made within the scope of the appended claims.

I claim:

1. An automatic frequency sweeping method for controlling a frequency synthesizing type autotuner for broadcasting receivers, in which said autotuner includes a phase locked loop for controllably generating a local oscillation signal, a mixer receiving a RF received signal and said local oscillation signal for generating an intermediate frequency signal, an intermediate frequency counter receiving said intermediate frequency signal through a gate, and a controller coupled to said phase locked loop, said intermediate frequency counter and said gate and also coupled with a key input used for providing an automatic frequency sweeping instruction, said controller responding to said automatic frequency sweeping instruction given through said key input so as to cause said phase locked loop to increment or decrement the frequency of said local oscillation signal, said controller operating to open said gate so as to allow said intermediate frequency signal to be inputted to said intermediate frequency counter so that said intermediate frequency signal is counted for a period in which said gate is opened, said controller also operating to examine whether or not a count value of said intermediate frequency counter is within a predetermined count range and to cause said phase locked loop to further increment or decrement said frequency of said local oscillation signal if said count value of the intermediate frequency counter is not within said predetermined count range, and said controller operating to cause said phase locked loop to stop the further increment or decrement of said frequency of said local oscillation signal if said count value of said intermediate frequency counter is within said predetermined count range, the method comprising a first intermediate frequency counting method in which said intermediate frequency signal is counted by opening said gate for a relatively short first period of time and the presence of the received signal is judged when said count value of said intermediate frequency counter is within a first range corresponding to a relatively wide intermediate frequency width and a second intermediate frequency counting method in which said intermediate frequency signal is counted by opening said gate for a second period of time longer than said first period of time and the presence of the received signal is judged when said count value of said intermediate frequency counter is within a second range corresponding to an intermediate frequency width narrower than said relatively wide intermediate frequency width, wherein when said automatic frequency sweeping instruction is given through said key input, a high speed frequency sweeping is ordinarily executed by using said first intermediate frequency counting method, and when the presence of said received signal is judged by said first intermediate frequency counting method, a more precise judgment is made in accordance with said second intermediate frequency counting method.

2. An automatic frequency sweeping method claimed in claim 1, wherein said intermediate frequency is 10.7 MHz and wherein said first time is 1 millisecond and said first range is 10,700±45, so that when said count value of said intermediate frequency counter is judged to be out of said first range in said first intermediate frequency counting method, said local oscillation frequency is changed by φKHz or 200 KHz.

3. An automatic frequency sweeping method claimed in claim 2, wherein in said first intermediate frequency counting method, whether or not said count value of said intermediate frequency counter is in said first range is judged three times by opening said gate for said first period of time, three times, without causing said phase locked loop to further increment or decrement the frequency of said local oscillation signal, and at least two of the three judgments indicate that said count value of said intermediate frequency counter is in said first range, it is then judged that said count value of said intermediate frequency counter is in said first range.

4. An automatic frequency sweeping method claimed in claim 3, wherein said second time is 4 milliseconds and said second range is 42,800±100, so that when said count value of said intermediate frequency counter is judged to be out of said first range in said second intermediate frequency counting method, the operation is returned to said first intermediate frequency counting method.

5. An automatic frequency sweeping method claimed in claim 4, wherein in said second intermediate frequency counting method, whether or not said count value of said intermediate frequency counter is in said second range is judged three times by opening said gate for said second period of time, three times, without causing said phase locked loop to further increment or decrement said frequency of said local oscillation signal and at least two of the three judgments indicate that said count value of said intermediate frequency counter is in said second range, it is then judged that said count value of said intermediate frequency counter is in said second range.

6. An automatic frequency sweeping method claimed in claim 1, wherein said second intermediate frequency counting method is executed at the start of said automatic frequency sweeping method, and said second intermediate frequency counting method is repeated by changing said intermediate frequency by 25 KHz as said narrower intermediate frequency width until said intermediate frequency is changed to XX.X75 MHz, wherein XX.X is any number, and thereafter, said first intermediate frequency counting method is executed, so that when said count value of said intermediate frequency counter is judged to be out of said first range, said local oscillation frequency is changed by 100 KHz.

7. An automatic frequency sweeping method claimed in claim 6, wherein said intermediate frequency is 10.7 MHz and wherein said first time is 1 millisecond and said first range is from 10,612 to 10,713.

8. An automatic frequency sweeping method claimed in claim 7, wherein in said first intermediate frequency counting method, whether or not said count value of said intermediate frequency counter is in said first range is judged three times by opening said gate for said first period of time, three times, without causing said phase locked loop to further increment or decrement said frequency of said local oscillation signal and at least two of the three judgments indicate that said count value of said intermediate frequency counter is in said first range, it is then judged that said count value of said intermediate frequency counter is in the first range.

9. An automatic frequency sweeping method claimed in claim 8, wherein said second time is 4 milliseconds and said second range is 42,800±50, so that when said count value of the intermediate frequency counter is judged to be out of said first range in said second intermediate frequency counting method, the operation is returned to said first intermediate frequency counting method.

10. An automatic frequency sweeping method claimed in claim 9, wherein in said second intermediate frequency counting method, whether or not said count value of said intermediate frequency counter is in said second range is judged three times by opening said gate for said second period of time, three times, without causing said phase locked loop to further increment or decrement said frequency of said local oscillator signal and at least two of said intermediate frequency counter is in said second range, it is then judged that said count value of said intermediate frequency counter is in said second range.

11. An automatic frequency sweeping method claimed in claim 1, wherein said intermediate frequency is 10.7 MHz and wherein said first and second times are 1 millisecond and 4 milliseconds, respectively and wherein said first range is from 10,612 to 10,713 and said second range is 42,800±50, wherein said second intermediate frequency counting method is executed at the start of said automatic frequency sweeping method while changing said local oscillation frequency by 25 KHz until said intermediate frequency is changed to XX.X75 MHz, wherein XX.X is any number, and thereafter said first intermediate frequency counting method is executed while changing said local oscillation frequency by 100 KHz until said count value of said intermediate frequency counter is in said first range, and then said second intermediate frequency counting method is executed again while changing said local oscillation frequency by 25 KHz until the presence of said received signal is detected.

12. In an automatic frequency sweeping frequency synthesizing type autotuner for broadcasting receivers, which autotuner includes a high frequency stage receiving a high frequency signal from an antenna, a phase locked loop for controllably generating a local oscillation signal, a mixer receiving a high frequency signal from said high frequency stage and said local oscillation signal for generating an intermediate frequency signal, an intermediate frequency counter receiving said intermediate frequency signal through a gate, and a controller coupled to said phase locked loop, said intermediate frequency counter and said gate and also coupled with a key input for instructing the automatic frequency sweeping, said controller operating to open said gate so as to allow said intermediate frequency counter to count the intermediate frequency and to stop the automatic frequency sweeping on the basis of presence or absence of said received signal judged with reference to the count value of said intermediate frequency counter, the improvement in that said controller selectively executes a first intermediate frequency counting method in which said intermediate frequency is counted by opening said gate for a relatively short first time and the presence or absence of said received signal is judged in a first range having a relatively wide intermediate frequency width and a second intermediate frequency counting method in which said intermediate frequency is counted by opening said gate for a second time longer than said first time and the presence or absence of said received signal is judged in a second range having an intermediate frequency width narrower than that of said first range, so that a high speed frequency sweeping is ordinarily executed by using said first intermediate frequency counting method, and when the presence of said received signal is judged in said first intermediate frequency counting method, a more precise judgment is made in accordance with said second intermediate frequency counting method.

13. A tuner claimed in claim 12, wherein said intermediate frequency is 10.7 MHz and wherein said controller is set to have said first time of 1 millisecond and said first range of 10,700±45, so that when said count value of said intermediate frequency counter is judged to be out of said first range in said first intermediate frequency counting method, said local oscillation frequency is changed by 100 KHz or 200 KHz.

14. An automatic frequency sweeping method claimed in claim 13, wherein said controller executes said first intermediate frequency counting method, in such a manner as to judge whether or not said count value of said intermediate frequency counter is in said first range three times and to judge that said count value of said intermediate frequency counter is in said first range when at least two of the three judgments indicate that said count value of said intermediate frequency counter is in said first range.

15. A tuner claimed in claim 14, wherein said controller is set to have said second time of 4 milliseconds and said second range of 42,800±100, so that when said count value of said intermediate frequency counter is judged to be out of said first range in said second intermediate frequency counting method, said controller is caused to return the operation to said first intermediate frequency counting method.

16. A tuner claimed in claim 15, wherein said controller executes said second intermediate frequency counting method, in such a manner as to judge whether or not said count value of said intermediate frequency counter is in said second range is judged three times by opening said gate for said second period of time, three times, without causing said phase locked loop to further increment or decrement said frequency of said local oscillator signal and to judge that said count value of said intermediate frequency counter is in said second range when at least two of the three judgments indicate that said count value of said intermediate frequency counter is in said second range.

17. A tuner claimed in claim 12, wherein said controller causes execution of said second intermediate frequency counting method at the start of said automatic frequency sweeping and said second intermediate frequency counting method is repeated by changing said intermediate frequency by 25 KHz as said narrower intermediate frequency width until said intermediate frequency is changed to XX.X75 MHz, wherein XX.X is any number, and thereafter, said controller causes execution of said first intermediate frequency counting method while changing said local oscillation frequency by 100 KHz when said count value of said intermediate frequency counter is judged to be out of said first range.

18. A tuner claimed in claim 17, wherein said intermediate frequency is 10.7 MHz and wherein said controller is set to have said first time of 1 millisecond and said first range is from 10,612 to 10,713, and
wherein said controller operates to execute said first intermediate frequency counting method in such a manner as to judge whether or not said count value of said intermediate frequency counter is in said first range three times and to conclude that said count value of said intermediate frequency counter is in said first range when at least two of the three judgments indicate that said count value of said intermediate frequency counter is in said first range.

19. A tuner claimed in claim 18, wherein said controller is set to have said second time of 4 milliseconds and said second range of 42,800±50, so that when said count value of said intermediate frequency counter is judged to be out of said first range in said second intermediate frequency counting method, the operation is returned to said first intermediate frequency counting method, and
wherein said controller operates to execute said second intermediate frequency counting method in such a manner as to judge whether or not said count value of said intermediate frequency counter is in said second range three times and to conclude that said count value of said intermediate frequency counter is in said second when at least two of the three judgments indicate that said count value of said intermediate frequency counter is in said second range.

20. A tuner claimed in claim 12, wherein said intermediate frequency is 10.7 MHz and wherein said controller is set to have said first and second times of 1 millisecond and 4 milliseconds, respectively and also to have said first range from 10,612 to 10,713 and said second range of 42,800±50, and
wherein said controller operates to execute said second intermediate frequency counting method at the start of said automatic frequency sweeping, and said second intermediate frequency counting method is repeated by changing said intermediate frequency by 25 KHz as said narrower intermediate frequency width until said intermediate frequency is changed to XX.X75 MHz, wherein XX.X is any number, and thereafter to execute said first intermediate frequency counting method while changing said first intermediate frequency counting method while changing said local oscillation frequency by 100 KHz until said count value of said intermediate frequency counter is in said first range, and then to execute said second intermediate frequency counting method again while changing said local oscillation frequency by 25 KHz until the presence of said received signal is detected.

* * * * *